(12) United States Patent
Mahowald

(10) Patent No.: US 8,306,235 B2
(45) Date of Patent: Nov. 6, 2012

(54) METHOD AND APPARATUS FOR USING A SOUND SENSOR TO ADJUST THE AUDIO OUTPUT FOR A DEVICE

(75) Inventor: Peter H. Mahowald, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 1140 days.

(21) Appl. No.: 11/778,785

(22) Filed: Jul. 17, 2007

(65) Prior Publication Data

US 2009/0022329 A1 Jan. 22, 2009

(51) Int. Cl.
*H03G 3/20* (2006.01)
*H03G 3/00* (2006.01)
(52) U.S. Cl. .................... 381/57; 381/104; 381/107
(58) Field of Classification Search .............. 381/57, 381/104, 107
See application file for complete search history.

(56) References Cited

U.S. PATENT DOCUMENTS

| | | | | |
|---|---|---|---|---|
| 4,829,565 | A * | 5/1989 | Goldberg | 379/390.01 |
| 5,666,426 | A * | 9/1997 | Helms | 381/57 |
| 2005/0226442 | A1* | 10/2005 | Landon et al. | 381/104 |
| 2005/0282590 | A1* | 12/2005 | Haparnas | 455/570 |
| 2007/0127879 | A1* | 6/2007 | Frank et al. | 386/46 |
| 2008/0069365 | A1* | 3/2008 | Shuttleworth et al. | 381/57 |

\* cited by examiner

*Primary Examiner* — Devona Faulk
*Assistant Examiner* — David Ton
(74) *Attorney, Agent, or Firm* — Blakely, Sokoloff, Taylor & Zafman LLP

(57) ABSTRACT

One embodiment of the present invention provides a system that uses a sound sensor to adjust the audio output of a device. During operation, the system uses the sound sensor to determine an ambient sound level for the environment in the proximity of the device. The system then adjusts a volume setting for the device adaptively based on the determined ambient sound level. Adaptively adjusting the volume setting allows the device to adapt to its audio environment and ameliorates potentially-disruptive audio outputs.

20 Claims, 6 Drawing Sheets

METHOD AND APPARATUS FOR USING A SOUND SENSOR TO ADJUST THE AUDIO OUTPUT FOR A DEVICE

BACKGROUND

1. Field of the Invention

The present invention relates to techniques for adjusting the audio output of a device. More specifically, the present invention relates to a method and an apparatus for adaptively adjusting the audio output for a device based on an ambient sound level measured by a sound sensor.

2. Related Art

Electronic devices such as televisions, computers, and mobile telephones are increasingly being used in a wide variety of environments for both business and entertainment purposes. However, as these devices become more widely used, their associated audio outputs are more likely to disturb other people. For instance, a user who adjusts the volume of a mobile phone ring tone for a loud environment may later move to a quieter environment, where the loud ring will be disruptive. Similarly, powering up a laptop computer in a quiet lecture hall or home may result in an inappropriately loud and disruptive boot sound. Alternatively, a volume level which is optimized for a quiet environment may not be detectable if the associated device is moved to a louder environment, which can result in a missed audio signal.

Hence, what is needed is a method that facilitates using electronic devices without the above-described problems.

SUMMARY

One embodiment of the present invention provides a system that uses a sound sensor to adjust the audio output of a device. During operation, the system uses the sound sensor to determine an ambient sound level for the environment in the proximity of the device. The system then adjusts a volume setting for the device adaptively based on the determined ambient sound level. Adaptively adjusting the volume setting allows the device to adapt to its audio environment and ameliorates potentially-disruptive audio outputs.

In some embodiments, the system considers one or more of the following factors when adjusting the volume setting for the device:
- an average sound level for the environment;
- a peak sound level for the environment;
- a frequency response for the environment;
- a minimum sound level for the environment;
- a characteristic for a type of sound detected in the environment; and
- the elapsed time since a previous volume setting adjustment.

In some embodiments, the system measures the ambient sound level for the environment during a time interval in which the audio output of the device is minimized.

In some embodiments, the system determines the initial ambient sound level for the environment at device boot time. The system may measure the ambient sound level for the environment over an ongoing time interval.

In some embodiments, the system determines the initial ambient sound level by powering on the sound sensor prior to powering on other portions of the device.

In some embodiments, the system determines whether adjusting the volume setting results in a subsequent user volume adjustment. If so, the system may adjust one or more parameters associated with volume-adjustment decision-making to account for user preferences.

In some embodiments, user volume adjustments for the device correspond to a specified signal-to-noise ratio. The system responds to such user volume adjustments by adjusting the device audio output to achieve the specified signal-to-noise ratio in the environment.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Adaptively Adjusting Audio Output

In one embodiment of the present invention, a device uses a sound sensor to adjust the audio output of a device to suit a given environment. During operation, the device uses the sound sensor to determine an ambient sound level for the environment in the proximity of the device. The device then adjusts the volume setting for the device adaptively based on the determined ambient sound level, thereby allowing the device to respond to its audio environment and ameliorating potentially-disruptive audio outputs. Such techniques facilitate outputting a sound level that is appropriate for the given environment, thereby providing both experiential and functional benefits for device users.

Figure 1:
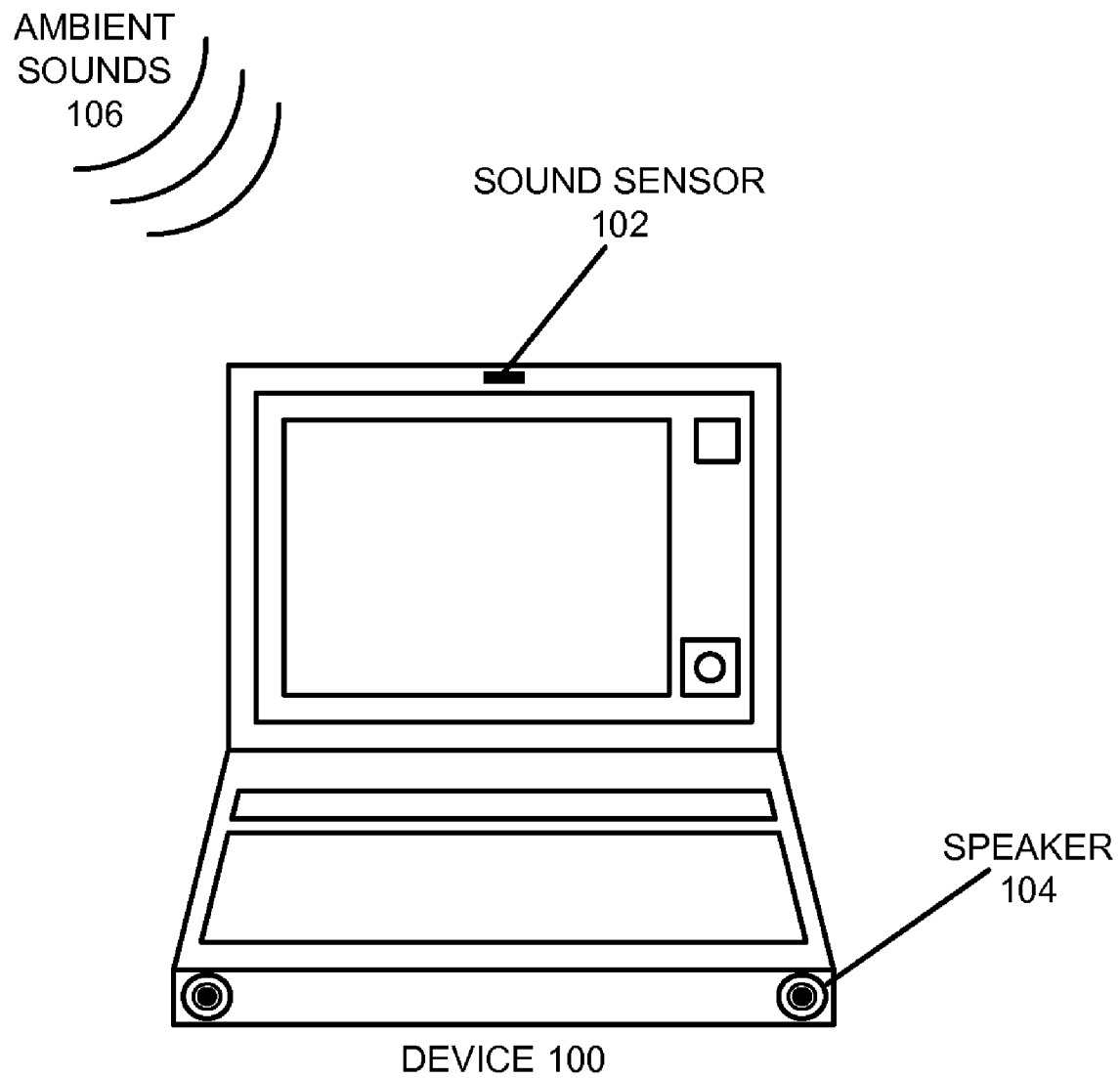
FIG. 1 illustrates a device that includes a sound sensor and an audio output device in accordance with an embodiment of the present invention.

The availability of increasingly-intelligent electronics has led to an increase in the number of devices that include built-in sound-sensing capabilities, such as advanced mobile communication devices, laptop computers, and entertainment devices. FIG. 1 illustrates a device 100 that includes a sound sensor 102 and an audio output device (such as a speaker 104). During operation, sound sensor 102 detects ambient sounds 106 in the proximity of device 100, which adjusts the audio output from speaker 104 in response.

Figure 2:
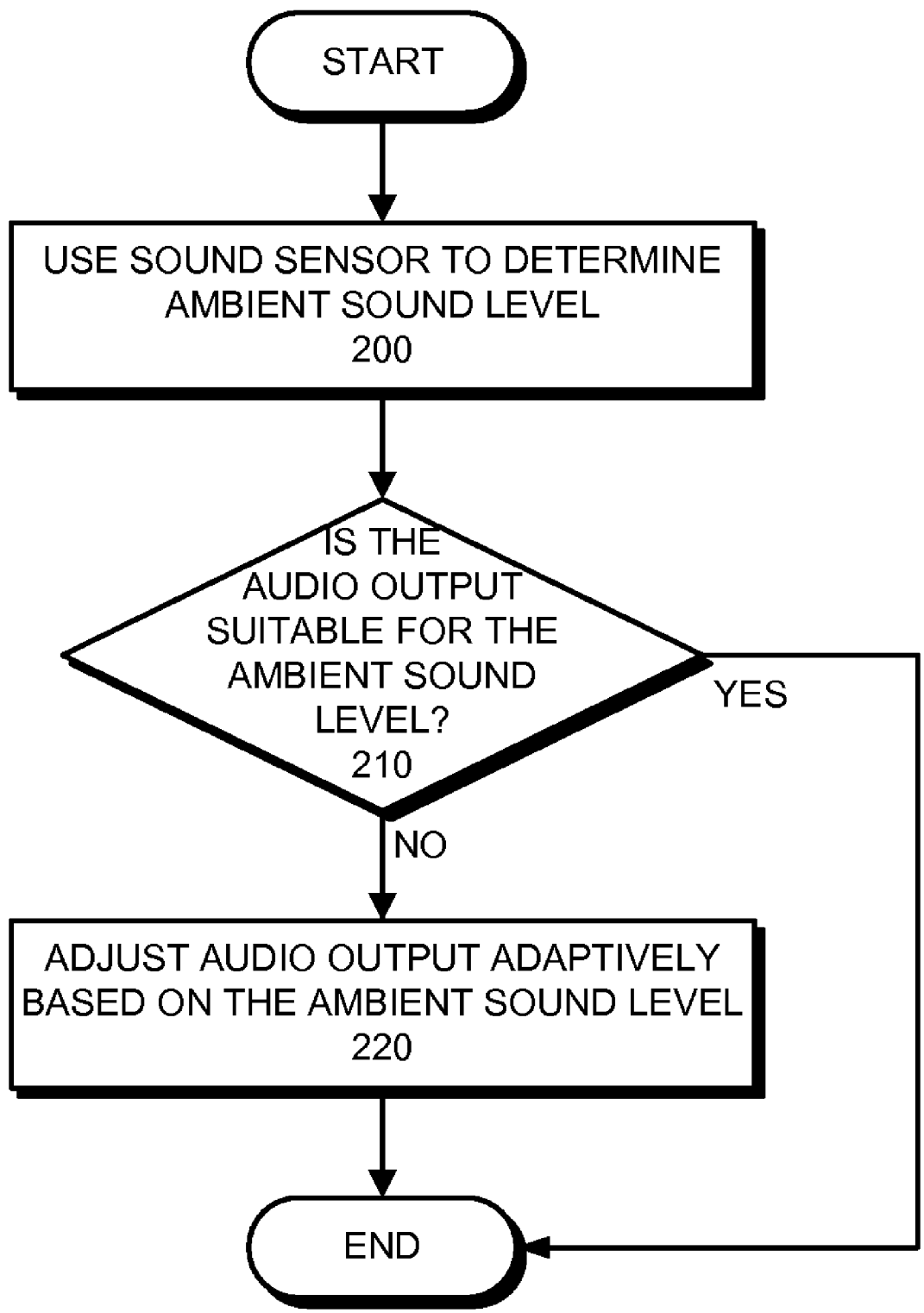
FIG. 2 presents a flow chart illustrating the process of using a sound sensor to adjust the audio output of a device in accordance with an embodiment of the present invention.

FIG. 2 illustrates the process of using a sound sensor to adjust the audio output of a device. During operation, the system uses the sound sensor to determine an ambient sound level for the environment in proximity to the device (operation 200). The system checks whether the audio output is suitable given the ambient sound level (operation 210), and if not, adjusts the audio output adaptively based on the ambient sound level (operation 220).

In one embodiment of the present invention, the system determines the ambient sound level for the environment by measuring the ambient sound level for the environment in a time interval during which the audio output of the device is minimized. For example, for a device playing music, the system may take samples from the sound sensor between songs, or between words in a song, to determine the ambient noise in a surrounding room. If the system detects that the room is loud, it may raise the device output volume. Alternatively, if the room is quiet, the system may lower the device output volume. Note that measuring the ambient sound during such time intervals (in which the audio output of the device is minimized or off) can avoid skewed sound measurements resulting from the audio output of the device itself, thereby allowing the system to adjust output sound levels in response to ambient sounds without needing to know the sound levels of the media content being output. Alternatively, the device may account for its own role in the measured sound levels, for instance by subtracting its own audio output (when known) from the sound levels measured by the sound sensor.

In one embodiment of the present invention, adjusting a volume setting for the device can involve determining one or more of the following:
- an average sound level for the environment;
- a peak sound level for the environment;
- a frequency response for the environment;
- a minimum sound level for the environment;
- a characteristic for a type of sound detected in the environment; and
- the elapsed time since a previous volume setting adjustment.

Note that determining whether a volume adjustment is needed can also involve determining time-dependent aspects of the sound. For instance, a temporary or percussive sound may not change the minimum sound level measured for the environment. Hence, the system may analyze two or more such factors when adjusting the sound output for a given environment. The system can also selectively change its audio output based on specific parameters, for instance by boosting specific frequencies based on the measured frequency response. The system may also adjust the hysteresis (or delay) of sound volume adjustments to smooth out volume changes and to avoid oscillations in the sound level output.

In one embodiment of the present invention, the system determines the ambient sound level for the environment during a boot sequence for the device, for instance prior to device playing an initialization sound (or "opening chord"). For instance, sound-processing circuitry can: (1) begin to estimate the ambient sound immediately upon power-on, thereby estimating the ambient sound level before other noise-producing components in the system begin generating noise, and then (2) provide this information in response to a request from the device's operating system after the device has successfully completed its boot sequence. The system can avoid slowing down the device's boot sequence by estimating the ambient sound using a separate processing unit, such as the processing unit that digitizes the microphone.

Figure 3:
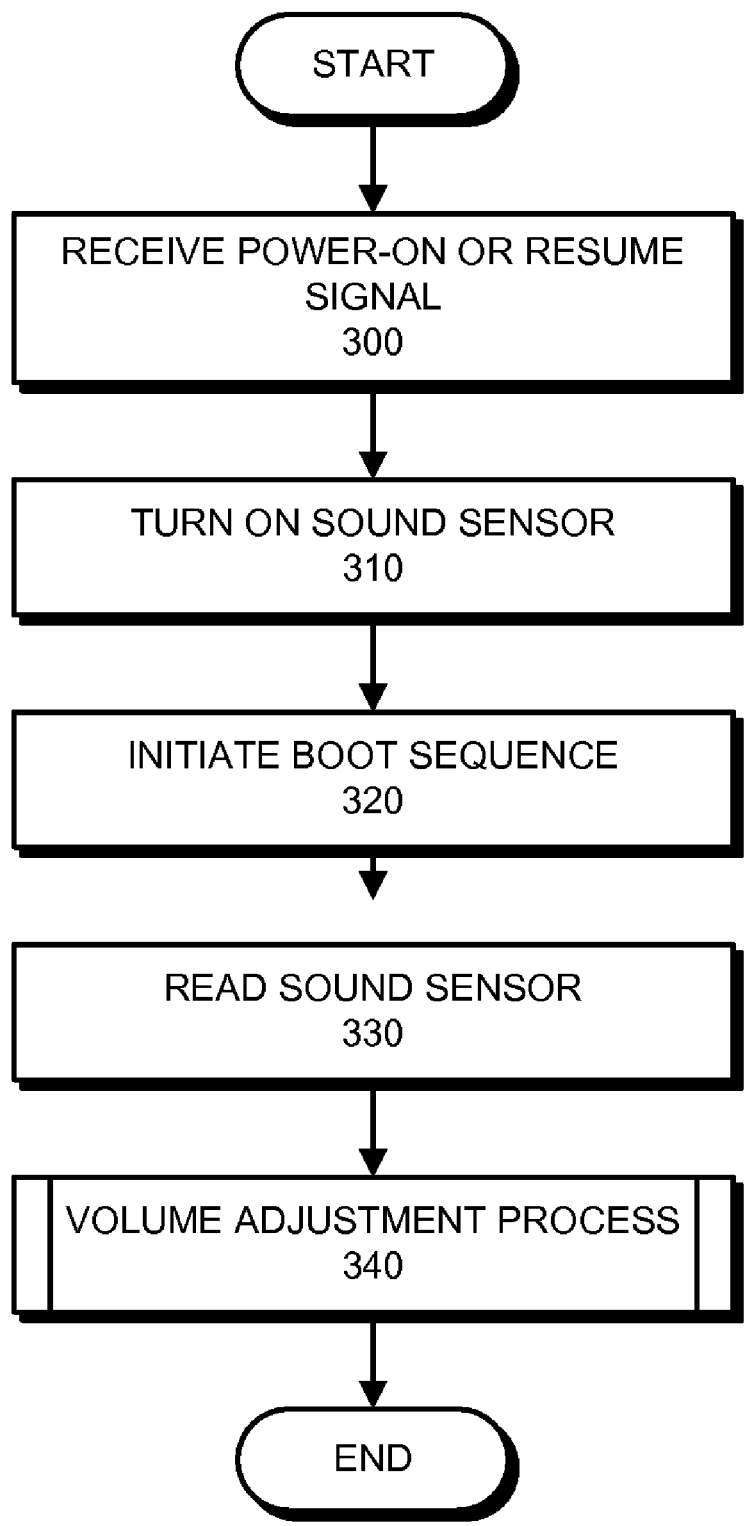
FIG. 3 presents a flow chart illustrating the process of determining the ambient sound level for an environment during a boot sequence in accordance with an embodiment of the present invention.

FIG. 3 illustrates the process of determining the ambient sound level for an environment during a boot sequence. After the system receives a power-on or "resume" signal (operation 300), the system immediately turns on the sound sensor (operation 310). The system detects the ambient sound level while initiating the boot sequence (operation 320), and then reads the sound sensor during or after the boot sequence has completed (operation 330). The system then proceeds to perform the volume adjustment process described in FIG. 2 (operation 340).

In one embodiment of the present invention, the system maintains one or more parameters that are used to determine whether, and if so, how much, to adjust the output sound level. For instance, the system may use a look-up table to determine the desired sound level based on the current sound level and the measured ambient sound level. Such a look-up table may be populated with an initial set of suggested values that are then adapted to specific user preferences over time based on learned behavior.

In one embodiment of the present invention, the system adaptively learns from to user volume adjustments. For instance, the system can detect whether user volume adjustments occur shortly after automatic system volume adjustments. If the system lowers the volume but detects that shortly afterwards the user raises the volume again, the system can in response lower the volume less during the next downward volume adjustment, or can offer to disable itself in a dialog. Hence, the system can interpret from user feedback whether automatic volume adjustments are erroneous and/or incorrect in magnitude, and compensate by adjusting the values in the look-up table.

Figure 4:
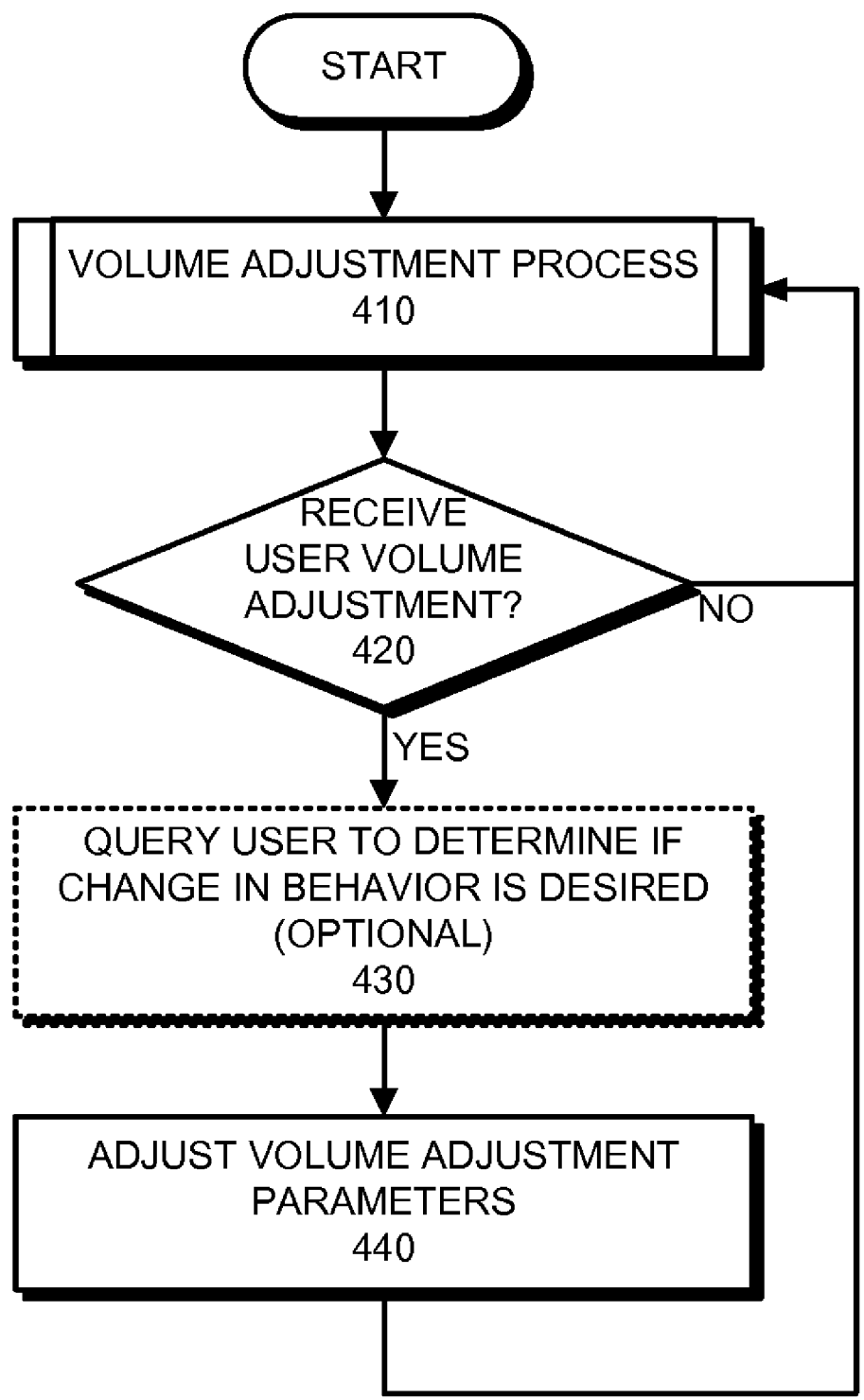
FIG. 4 presents a flow chart illustrating the process of incorporating user feedback into the automatic volume adjustment process in accordance with an embodiment of the present invention.

FIG. 4 illustrates the process of incorporating user feedback into the automatic volume adjustment process. During operation, the system performs the volume adjustment process described in FIG. 2 (operation 410). The system then tracks whether any subsequent user volume adjustments are received (operation 420). Because such an adjustment may indicate an erroneous automatic volume adjustment, the system may optionally query the user to determine whether a change in system behavior is desired (optional operation 430). For instance, the system may ask the user whether the automatic volume adjustment process should be halted, or whether the magnitude of adjustments should be decreased or increased. The system may then adjust the set of parameters used for volume adjustment and magnitude decisions accordingly (operation 440), based either on the direct user feedback (from optional operation 430) or automatically based on the measured sound levels and the type and magnitude of the user volume adjustment. Note that the system may monitor all user-prompted volume adjustments, not just those that directly follow an automatic volume adjustment. The system can use patterns detected from tracking independent user volume adjustments and ambient sound levels may be used to adaptively learn user preferences and adjust thresholds for automatic volume adjustment.

In one embodiment of the present invention, a device's volume adjustment controls can be configured (at the user's option) to either control the absolute output volume directly or to instead control the output volume relative to the ambient "noise." In the latter scenario, the volume control becomes a signal-to-noise (S/N) adjuster rather than a signal-only (S-only) adjuster. In some embodiments, such automatic volume control may result in dramatically reducing the need to manually adjust volume, with users only needing to adjust the levels on very rare occasions.

To achieve such automatic volume control functionality in a group environment, the system may associate a separate volume preference, either S-only or S/N, with each given user instead of maintaining a single global setting for the device. Separate audio profiles can, for instance, allow the system to automatically increase the audio volume of a family media center for a hearing impaired user without disturbing the settings of other family members. Separate audio profiles can also be used to support user-specific sensitivity to different noise types and a range of preferred time delays for volume adjustment operations.

Figure 5:
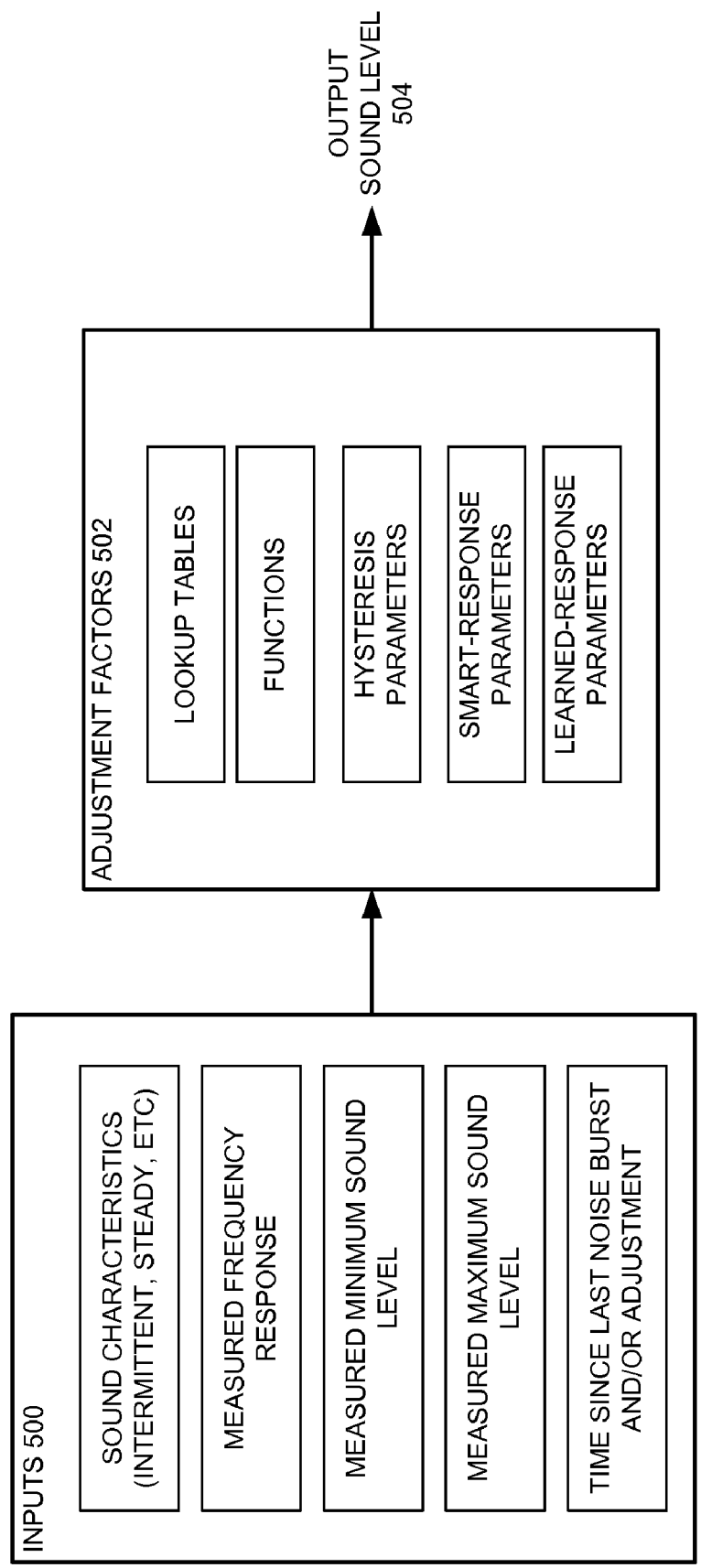
FIG. 5 illustrates an exemplary set of inputs and adjustment factors for a volume adjustment process in accordance with an embodiment of the present invention.

FIG. 5 illustrates an exemplary set of inputs and adjustment factors for a volume adjustment process. Inputs 500 can include: sound characteristics (e.g. intermittent, steady, etc.), a measured frequency response, a measured minimum sound level, a measured maximum sound level, and the time elapsed since the last noise burst and/or adjustment. These inputs 500 can be used by the system during the adjustment process, along with a set of adjustment factors 502 that can include: lookup tables, functions, hysteresis parameters, smart-response parameters, and learned-response parameters. These adjustment factors 502 can include both pre-programmed and user-influenced parameters, and are used to determine the output sound level 504.

Note that the techniques described can be applied to any device that generates audio output and includes a sound sensor, and can be applied to a wide range of environments including home, business, and automotive environments. The system may vary its behavior depending on the environment, the audio output device, and the given application. For instance, the system might detect when headphones are being used, and, because ambient noise is not as noticeable to a user with headphones, adjust accordingly by reverting to an S-only setting rather than an S/N setting. Alternatively, the system might follow the assumption that ambient sound levels can still interfere with headphone listening (and are sometimes a factor that lead to headphone use), and compensate by using a higher S/N target.

Figure 6A:
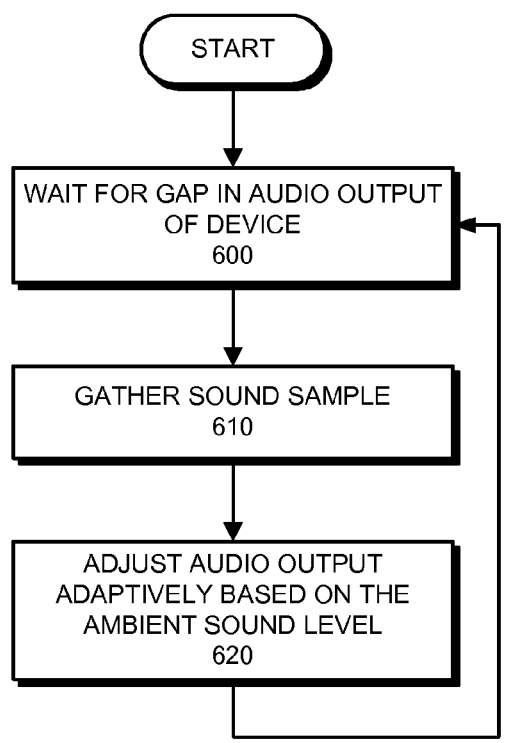
FIG. 6A presents a flow chart illustrating the process of adjusting the audio output volume for a device without headphones in accordance with an embodiment of the present invention.
Figure 6B:
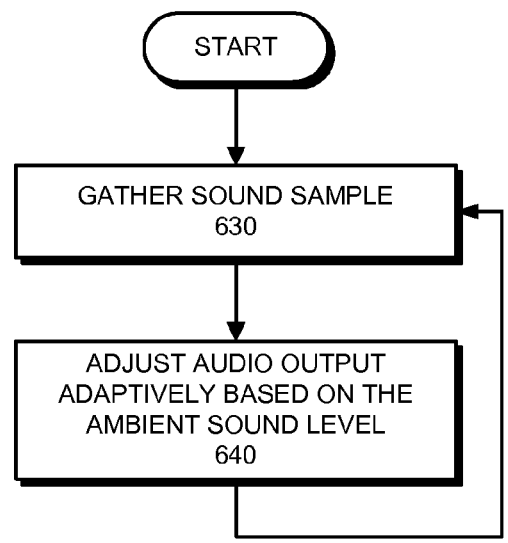
FIG. 6B presents a flow chart illustrating the process of adjusting the audio output volume for a device with headphones in accordance with an embodiment of the present invention.

FIGS. 6A-6B illustrate the difference in the volume adjustment process for two embodiments of the present invention that do (FIG. 6B) and do not (FIG. 6A) output audio using headphones. In FIG. 6A, the system, during operation, waits for a gap in the audio output of the device (operation 600) to gather a sound sample (operation 610), and then adjusts the audio output of the system adaptively based on the measured ambient sound level (operation 620). In FIG. 6B, because the system is being used with headphones, the sound sensor primarily measures the ambient noise, and hence does not need to know anything about the media playing nor wait for a gap in the audio output. A system outputting audio via headphones can gather sound samples (operation 630) and adjust the audio output adaptively based on the ambient sound level (operation 640) at will. Note that a system may alternate between outputting audio via headphones and non-headphone speakers during operation. For instance, an audio/visual system supporting network-based communication may monitor feedback noise and adjust the volume or frequency response of the audio output during operation. If the sound sensor detects echoes from the audio output, the system might recommend headphone use and/or trigger (or suggest that the user trigger) echo cancellation blanking. Alternatively, the system can also automatically adjust the volume to a lower level if echo effects are detected.

In one embodiment of the present invention, the system uses a "hacker-proof" sound-sensor digitization circuit that prevents malicious entities from downloading instructions that can take control of the sound sensor and record audio without the user's knowledge. Such a digitization circuit can be achieved using one or more of the following techniques:

A closed hardware sound-sensing system. For instance, the system can perform sound-sensing using a silicon chip that controls the sound sensor and outputs sound samples, but does not support any additional functionality, and hence cannot be hijacked to secretly record audio.

A silicon-based sound-sensor digitizer that illuminates an indicator whenever a key element is operated continuously for longer than a specified time-sample interval. For instance, such a digitizer could illuminate a light-emitting diode that is hard-coded into the sound sensor whenever a high speed analog-to-digital converter is operated for longer than one second in a given time interval.

A firmware program for the sound-sensor digitizer that is protected from external reads or writes after the manufacturing processes has completed.

In summary, one embodiment of the present invention uses a sound sensor to adaptively adjust the audio output of a device to suit a changing environment. The system determines an ambient sound level for the environment in proximity to the device, and then adjusts the volume setting for the device adaptively based on that ambient sound level. Hence, the system ensures that the device outputs an appropriate sound level over time, even when faced with movement to a different environment or changes to the ambient sound level of the given environment.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for using a sound sensor to adjust the audio output of a device, comprising:
   determining an initial ambient sound level for an environment in proximity to the device during a boot sequence for the device, wherein determining the initial ambient sound level comprises using the sound sensor to determine the initial ambient sound at power-on, before other noise-producing components in the device begin generating noise;
   subsequent to the boot sequence, using the sound sensor to determine an ambient sound level for the environment in proximity to the device; and
   adaptively adjusting a volume setting for the device based on the determined initial ambient sound level; and
   after adaptively adjusting the volume setting based on the determined initial ambient sound, adaptively adjusting the volume setting for the device based on the determined ambient sound level.

2. The method of claim 1, wherein adjusting the volume setting for the device involves determining one or more of:
   an average sound level for the environment;
   a peak sound level for the environment;

a frequency response for the environment;
a minimum sound level for the environment;
a characteristic for a type of sound detected in the environment; and
the elapsed time since a previous volume setting adjustment.

3. The method of claim 1, wherein determining the ambient sound level for the environment involves measuring the ambient sound level for the environment in a time interval during which the audio output of the device is minimized.

4. The method of claim 3, wherein using the sound sensor to determine an ambient sound level for the environment in proximity to the device comprises measuring the ambient sound level for the environment in one or more time intervals.

5. The method of claim 1, wherein adjusting the volume setting further involves:
determining that a user volume setting adjustment occurred within a predetermined time of an adaptive adjustment to the volume setting; and
adjusting at least one of a magnitude of adaptive adjustments to the volume setting or volume setting thresholds for adaptive volume adjustment.

6. The method of claim 5,
wherein a user volume adjustment adjusts a volume control setting for the device that corresponds to a specified signal-to-noise ratio; and
wherein the device adjusts its audio output to achieve the specified signal-to-noise ratio in the environment.

7. The method of claim 1, wherein adjusting the volume setting for the device involves determining:
a characteristic for a type of sound detected in the environment; and
the elapsed time since a previous volume setting adjustment, wherein adaptively adjusting the volume setting comprises delaying sound volume adjustments based on the elapsed time to smooth out volume changes and to avoid oscillations in sound level outputs.

8. The method of claim 1, wherein the method further comprises:
recording volume adjustment data, wherein the volume adjustment data comprises user adjustments to the volume setting, adaptive adjustments to the volume setting, and ambient sound levels;
determining user preferences for volume adjustments based on the volume adjustment data; and
based on the user preferences, adjusting at least one of a magnitude of adaptive volume adjustments and a threshold for adaptive volume adjustment.

9. A non-transitory computer-readable storage medium storing instructions that when executed by a computer cause the computer to perform a method for using a sound sensor to adjust the audio output of a device, the method comprising:
determining an initial ambient sound level for an environment in proximity to the device during a boot sequence for the device, wherein determining the initial ambient sound level comprises using the sound sensor to determine the initial ambient sound at power-on, before other noise-producing components in the device begin generating noise;
subsequent to the boot sequence, using the sound sensor to determine an ambient sound level for the environment in proximity to the device;
adaptively adjusting a volume setting for the device based on the determined initial ambient sound level; and
after adaptively adjusting the volume setting based on the determined initial ambient sound, adaptively adjusting the volume setting for the device based on the determined ambient sound level.

10. The computer-readable storage medium of claim 9, wherein adjusting the volume setting for the environment involves determining one or more of:
an average sound level for the environment;
a peak sound level for the environment;
a frequency response for the environment;
a minimum sound level for the environment;
a characteristic for a type of sound detected in the environment; and the elapsed time since a previous volume setting adjustment.

11. The computer-readable storage medium of claim 9, wherein determining the ambient sound level for the environment involves measuring the ambient sound level for the environment in a time interval during which the audio output of the device is minimized.

12. The computer-readable storage medium of claim 11,
wherein using the sound sensor to determine an ambient sound level for the environment in proximity to the device comprises measuring the ambient sound level for the environment in one or more time intervals.

13. The computer-readable storage medium of claim 9, wherein adjusting the volume setting further involves:
determining that a user volume setting adjustment occurred within a predetermined time of an adaptive adjustment to the volume setting; and
adjusting at least one of a magnitude of adaptive adjustments to the volume setting or volume setting thresholds for adaptive volume adjustment.

14. The computer-readable storage medium of claim 13,
wherein a user volume adjustment adjusts a volume control setting for the device that corresponds to a specified signal-to-noise ratio; and
wherein the device adjusts its audio output to achieve the specified signal-to-noise ratio in the environment.

15. An apparatus that uses a sound sensor to adjust the audio output of a device, comprising:
a sound sensor configured to determine an initial ambient sound level for an environment in proximity to the device during a boot sequence for the device, wherein determining the initial ambient sound level comprises determining the initial ambient sound at power-on, before other noise-producing components in the device begin generating noise;
wherein the sound sensor is further configured to determine an ambient sound level for the environment in proximity to the device subsequent to the boot sequence; and
an adjusting mechanism configured to adaptively adjust a volume setting for the device based on the determined initial ambient sound level,
wherein, after adaptively adjusting the volume setting based on the determined initial ambient sound, the adjusting mechanism is further configured to adaptively adjust the volume setting for the device based on the determined ambient sound level.

16. The apparatus of claim 15, wherein the adjusting mechanism is further configured to adjust the volume setting by determining one or more of:
an average sound level for the environment;
a peak sound level for the environment;
a frequency response for the environment;
a minimum sound level for the environment;
a characteristic for a type of sound detected in the environment; and the elapsed time since a previous volume setting adjustment.

17. The apparatus of claim 15, wherein determining the ambient sound level for the environment involves measuring the ambient sound level for the environment in a time interval during which the audio output of the device is minimized.

18. The apparatus of claim 17, wherein, when determining an ambient sound level for the environment in proximity to the device, the sound sensor is configured to measure the ambient sound level for the environment in one or more time intervals.

19. The apparatus of claim 15, wherein adjusting the volume setting further involves:

determining that a user volume setting adjustment occurred within a predetermined time of an adaptive adjustment to the volume setting; and adjusting at least one of a magnitude of adaptive adjustments to the volume setting or volume setting thresholds for adaptive volume adjustment.

20. The apparatus of claim 15, wherein the sound sensor comprises a closed hardware sound-sensor digitization circuit that outputs sound samples to the adjusting mechanism but does not support any additional functionality; and wherein the closed hardware sound-sensor digitization circuit is configured to prevent a secret recording of audio for purposes other than adaptive volume adjustment.

* * * * *